(12) United States Patent
Zhou

(10) Patent No.: US 7,499,301 B2
(45) Date of Patent: Mar. 3, 2009

(54) PLUGTYPE POWER SUPPLY UNIT

(75) Inventor: Zhenghong Zhou, Shenzhen (CN)

(73) Assignee: Tinyplug Technology (Shenzhen) Limited, Guangdong Province (CN)

( * ) Notice: Subject to any disclaimer, the term of this patent is extended or adjusted under 35 U.S.C. 154(b) by 266 days.

(21) Appl. No.: 11/482,247

(22) Filed: Jul. 7, 2006

(65) Prior Publication Data

US 2008/0009145 A1     Jan. 10, 2008

(51) Int. Cl.
*H02M 1/00*     (2007.01)
(52) U.S. Cl. .................................. 363/146; 439/131
(58) Field of Classification Search ......... 363/141–146; 439/501, 502, 528, 530, 638, 652, 131, 172
See application file for complete search history.

(56) References Cited

U.S. PATENT DOCUMENTS

| | | | | |
|---|---|---|---|---|
| 4,495,446 A | * | 1/1985 | Brown et al. ................. | 315/206 |
| 6,059,584 A | * | 5/2000 | Mareno ........................ | 439/131 |
| 7,259,975 B2 | * | 8/2007 | Holme Pedersen et al. .. | 363/146 |

* cited by examiner

*Primary Examiner*—Rajnikant B Patel
(74) *Attorney, Agent, or Firm*—Morris Manning Martin LLP; Tim Tingkang Xia, Esq.

(57) ABSTRACT

A plugtype power supply unit includes an enclosure, a plug portion secured thereto, and a low-voltage cord extending from said enclosure. Each cross-sectional configuration of said enclosure with said plug portion corresponds to and does not exceed the cross-sectional configuration of a plug face of an American type plug according to the NEMA 1-15P standard. A switch mode power supply circuit mounted on a PCB is built into said enclosure, said switch mode power supply circuit includes a transformer for power converting and a capacitor for regulating an input voltage, a central axis of said capacitor is disposed parallel to the direction of said PCB.

27 Claims, 9 Drawing Sheets

PLUGTYPE POWER SUPPLY UNIT

BACKGROUND OF THE INVENTION

1. Field of the Invention

The present invention relates to power supply devices, and particularly to a plugtype power supply unit having function of an AC/DC power supply and structural configuration thereof complies with American Standard NEMA 1-15P and can be inserted into the American standard receptacle.

2. Description of the Prior Art

Nowadays, most electronic products, especially portable consumer electronic products, such as mobile phones, mp3 players, CD players and so on, need low-voltage power, often from 3 v to 5 v, and have low power consumption from 1 w to 20 w. Conventionally a power supply unit with an AC/DC converting function is needed to achieve a low voltage. As electronic technologies evolve, electronic products are becoming smaller and smaller, being portable and smart. Accordingly, the dimensions and structural configurations of the power supply units have to meet more rigorous specifications.

Over time there have been several inventions focused on integrating AC/DC converters into the mains plug used for the mains power supply. All over the world different standards for electronic devices exist, and AC/DC power supplies must comply with these standards. One set of such standards are the IEC standards. IEC 60950 describes the minimum requirements for electrical equipment with regard to isolation and minimum distances between components with different voltage levels. IEC 61000 describes minimum requirements for electromagnetic compatibility (EMC). Usually, some standards are also set out for the shape of electric/electronic devices. In the case of plug devices, the standard NEMA 1-15P is set out and applies to plug devices in the US. In the following, the plug size will be referred to as an American type plug.

The plug device is of small physical dimensions, thus requiring special attention to the arrangement of components in order to comply with standards like the IEC standards, however, prior technologies have only managed to partially accomplish an AC/DC power supply integration into a plug-type device to a degree, which is primarily due to the physical size of the converting circuit, which previously tended to be large and bulky.

U.S. Pat. No. 4,273,406 describe an AC/DC power supply accommodated within a plug device. In this power supply device a linear type transformer is retained in a two-part cylindrical casing fastened with a screw. There are several drawbacks of said invention due to its application of a large linear type transformer. The most severe drawback is that the casing is large and heavy. Furthermore, the plug is not easily fitted into the European type sockets.

WO 01/08270 describes an AC/DC adapter of a type similar to U.S. Pat. No. 4,273,406. The invention according to WO 01/08270 fits into European type sockets. However, this is achieved by having a section with the input connectors adapted for insertion into the socket. The remaining components are housed in a large compartment attached to this section.

Presently, most power supply devices adopt switch mode power supply (SMPS) circuits. WO 94/06177, equivalent to German utility model G 9320893U1, describes a European type plug with a built-in power supply. The described SMPS is a Flyback converter. However, the publication does not describe how the SMPS can be arranged inside the plug device and at the same time comply with the required standards.

One of the problems with this type of SMPS is that the creepage and clearance distances must be approximately 5 mm in order for the product to be approved with the safety standards.

Prior art AC/DC power supplies have not been able to exploit the advantages of the switching technology while at the same time feature a compact design which fits into mains European type plug. The two main reasons are that as the dimensions shrink, a new set of problems arrive due to the required primary side to secondary side isolation, and problems in relation to EMC arise due to the switching technology. Several problems within different technical fields will have to be solved simultaneously in order to construct a plug device with small dimensions, preferably of the American type size or even smaller.

BRIEF SUMMARY OF THE INVENTION

One objective of the present invention is to provide a power supply unit which fits into a plug device, such as an American type plug. Furthermore, a power supply unit according to the present invention must fulfill the requirements of basic performance and various safety and EMC regulations as stated in the above mentioned standards in order to be approved. To achieve the above-mentioned objective, a plugtype power supply unit in accordance with a preferred embodiment of the present invention includes an enclosure, a plug portion secured thereto, and a low-voltage cord extending from said enclosure. Each cross-sectional configuration of said enclosure with said plug portion corresponds to and does not exceed the cross-sectional configuration of a plug face of an American type plug according to the NEMA 1-15P standard. A switch mode power supply circuit mounted on a PCB is built into said enclosure, said switch mode power supply circuit includes a transformer for power converting and a capacitor for regulating an input voltage, a central axis of said capacitor is disposed parallel to the direction of said PCB.

According to a preferred embodiment of the present invention, at least one shielding winding is provided between a primary winding and a secondary winding of said transformer. An external surface of said transformer is wrapped in a three-layer high voltage proof insulating tape for achieving isolation complying with safety standards. A secondary winding of said transformer is winded by three-layer insulating lines, and is welded on a lower-voltage side of said PCB by means of flying leads. An external surface of said transformer is wrapped in a copper foil functioning like a shielding connected to an earth contact of the primary winding for achieving an EMI suppressing effect. Said switch mode power supply circuit further comprises an insurance resistance to throttle down a surge current from a mains power supply, and at least one filter network comprising a capacitor and an inductor. Said switch mode power supply circuit further comprises a control IC with a switching frequency vibration. Components of said switch mode power supply circuit mounted on said PCB adjacent to a dangerous high voltage or with a dangerous high voltage are wrapped in three-layer high voltage proof insulating tapes, such as said capacitor. A plurality of slots is formed in said PCB between a dangerous high-voltage side and a low-voltage side of said switch mode power supply circuit. A plurality of ribs extends from an inner wall of said enclosure corresponding to the slot at said PCB, not only for isolating components or wires at both sides of said slot of said PCB, but also for strengthening mechanical integrity of said enclosure. A plurality of Mylar sheets is disposed on said PCB between components and wires required to be isolated. A design of dimension and configuration of said plug portion and said frontwall of said enclosure is based on the plug standard corresponding to various countries and districts.

The plugtype power supply unit according to the present invention has the function of an AC/DC power supply and structural configuration thereof complies with American Standard NEMA 1-15P and is able to be inserted into the American standard receptacle. Furthermore, the power supply unit according to the present invention complies with the requirements of various safety standards and EMC regulations.

DETAILED DESCRIPTION OF THE INVENTION

Figure 1:
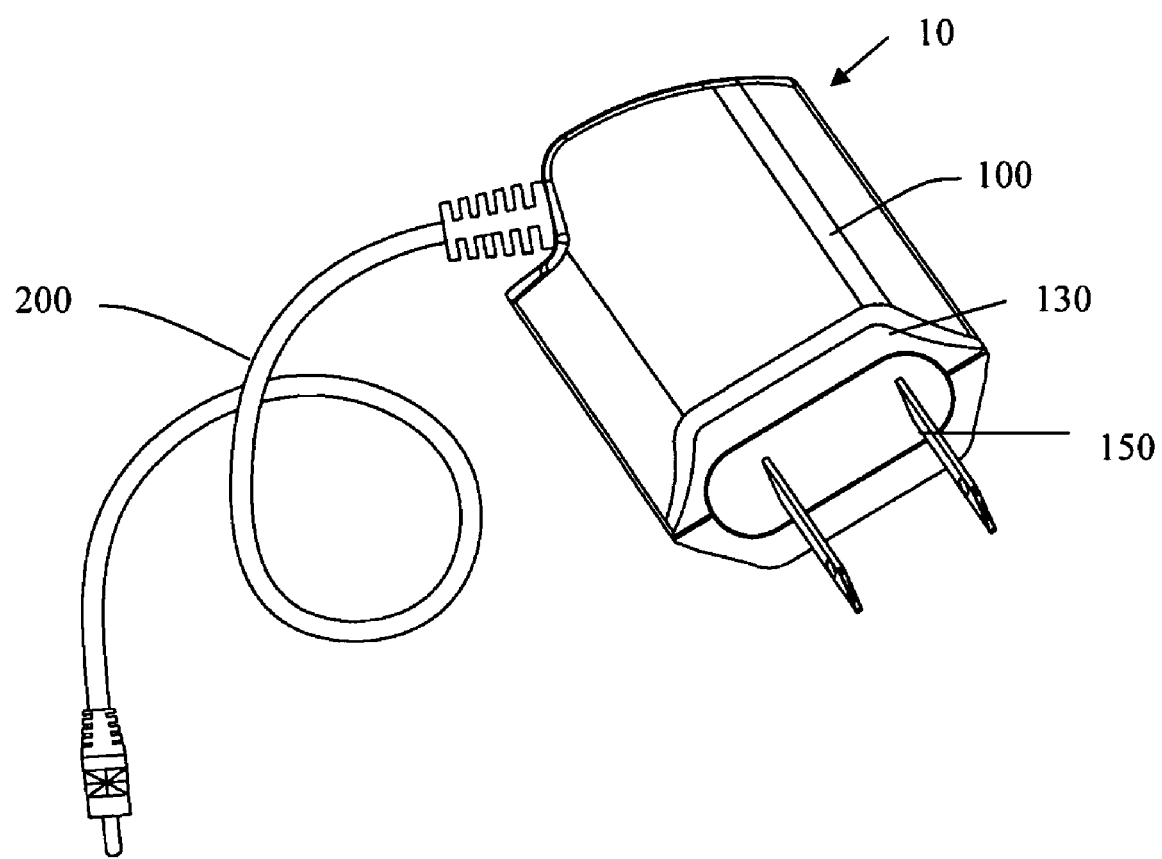
FIG. 1 is an isometric view of a plugtype power supply unit in accordance with the preferred embodiment of the present invention, the plugtype power supply unit comprising an enclosure, a plug portion and a low-voltage cord.
Figure 2:
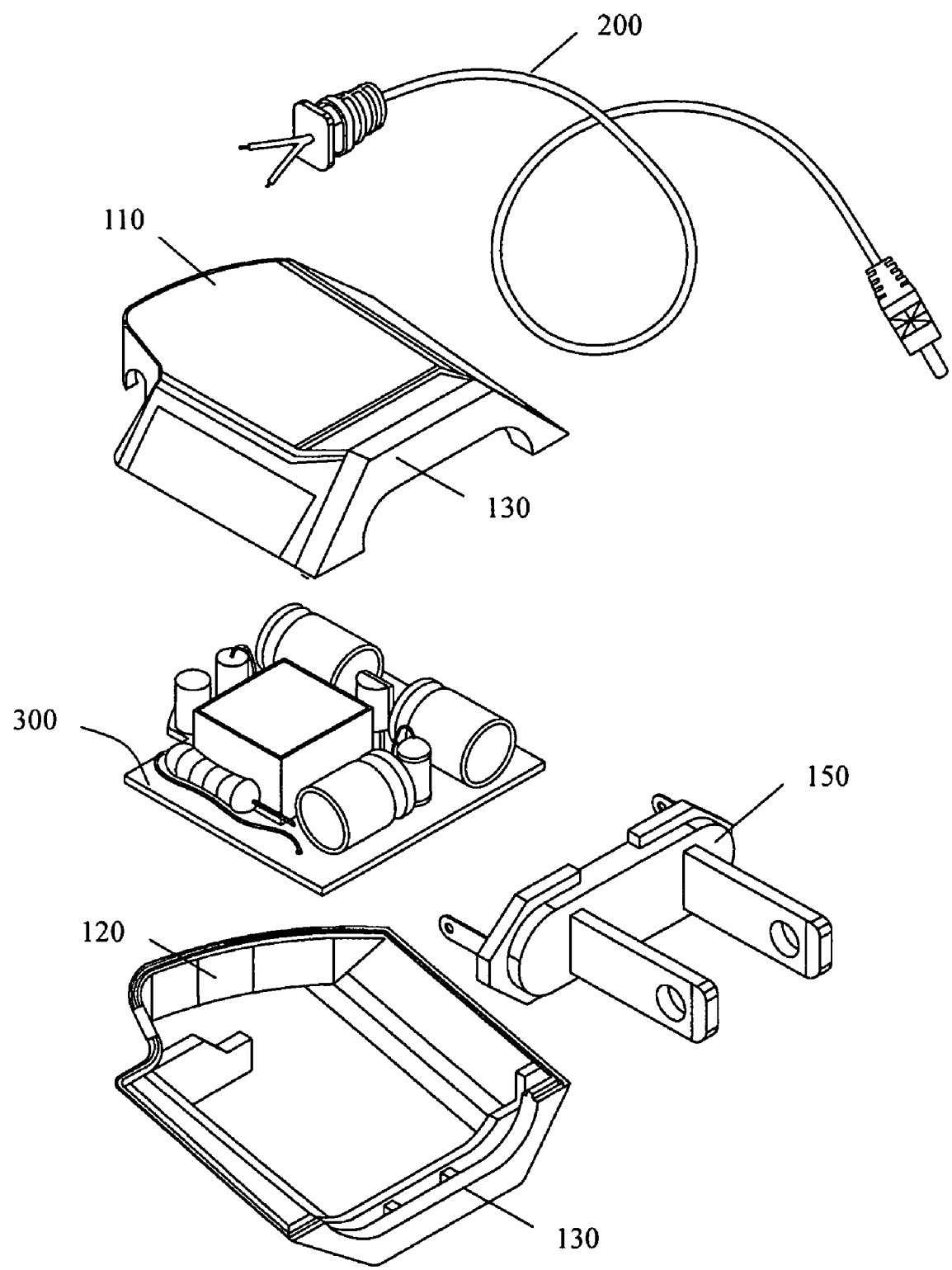
FIG. 2 is an exploded, isometric view of the plugtype power supply unit of FIG. 1.

Referring to FIG. 1 and FIG. 2, a plugtype power supply unit 10 in accordance with the preferred embodiment of the present invention comprises an enclosure 100, a plug portion 150, a low-voltage cord 200 and a printed circuit board (PCB) 300 of a switch mode power supply (SMPS) circuit accommodated in the enclosure 100. The enclosure 100 comprises an upper shell 110 and a lower shell 120, which defines a frontwall 130. The plug portion 150 is secured to the frontwall 130. The low-voltage cord 200 is connected to the rear part of the enclosure 100.

Figure 3:
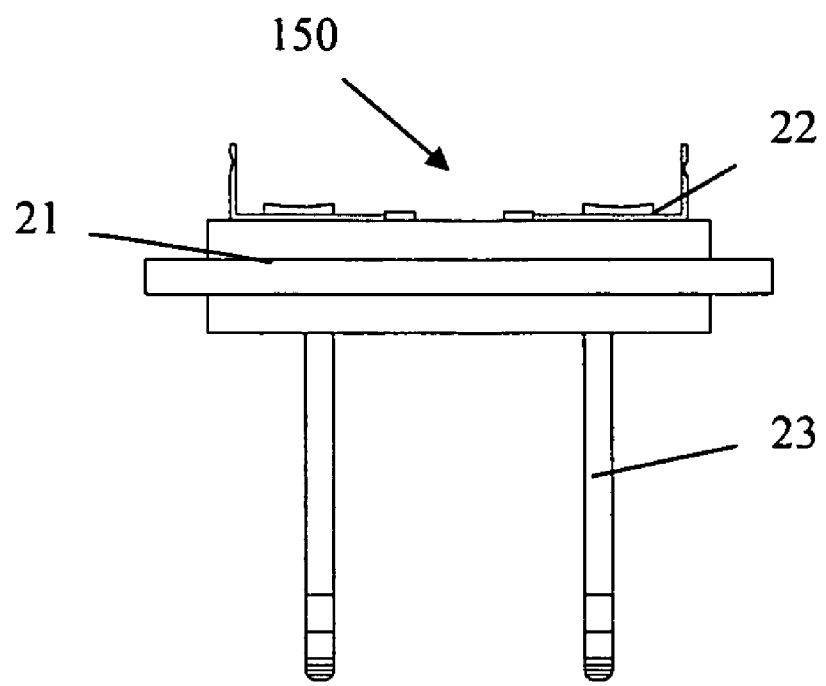
FIG. 3 is a schematic view of the plug portion of the plugtype power supply unit in accordance with a preferred embodiment of the present invention.

The plug portion 150 engaged tightly with the enclosure 100 guides electric energy from the mains power supply. The electric energy is input into the enclosure 100 via the plug portion 150, and then AC/DC converted by the SMPS circuit and output to the terminal devices via the low-voltage cord 200. Also, referring to FIG. 3, the plug portion 150 comprises a plug base 21, a plurality of metal sheets 22 for electric connection to the PCB 300, and a pair of plug-in pins 23 extending from the plug base 21.

Figure 4:
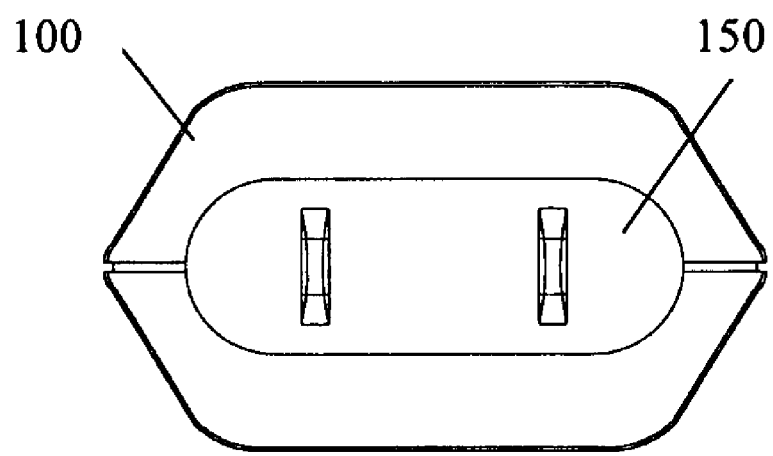
FIG. 4 is a front view of the plugtype power supply unit with the plug portion assembled in the enclosure, which is adapted to American Standard NEMA 1-15P.

FIG. 4 shows the front view of the plugtype power supply unit 10 with the plug portion 150 assembled in the enclosure 100, which is adapted to American Standard NEMA 1-15P. In different embodiments, the plug portions 150 of the present invention can be plug portions 150 adapt to different standards of corresponding counties and districts. The plug portions 150 can be adapted to different standards of different counties and districts by changing shapes of the pins 23 correspondingly. The frontwall 130 of the enclosures 100 are designed according to different standards of different counties and districts, engaging with the corresponding plug portions 150, for complying with different standards, such as American Standard NEMA 1-15P, European Standard EN 50075, Korean Standard KSC 8305, Japanese Standard JIS C 8303 and so on. In some embodiments of the present invention, the plug portion 150 is replaceable among predesigned plug portions 150 of different types. To reduce the space of the plugtype power supply unit 10 occupied by the plug portion 150, the plug base 21 is designed as thin as possible, but for maintaining mechanical integrity, it is larger than 2 mm.

Figure 5:
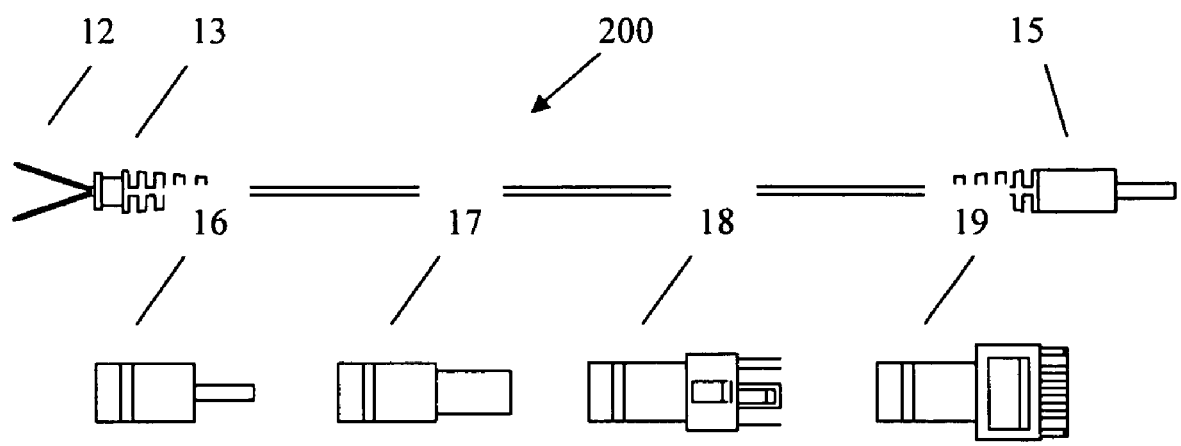
FIG. 5 is a schematic view of the low-voltage cord of the plugtype power supply unit in accordance with a preferred embodiment of the present invention.

Referring to FIG. 5, the low-voltage cord 200 shown in FIG. 5 is a power output portion of the plugtype power supply unit 10 of the present invention. The low-voltage cord 200 extends from one side of the rear part of the plugtype power supply unit 10 (as shown in FIG. 1). The low-voltage cord 200 comprises a wire 12, a strain relief 13 and a connector 15. The strain relief 13 is responsible for preventing the connection of the low-voltage cord 200 and the enclosure 100 from easy being broken. The connector 15 is connected directly to the terminal devices, such as a mobile phone etc., providing them with a stable supply of electrical energy. There are different connectors corresponding to different terminal devices, such as connector 16, 17, 18 and 19. The flexible design not only brings convenience to users, but also benefits the producers because only one standard cable needs to be made with various connectors.

Figure 6:
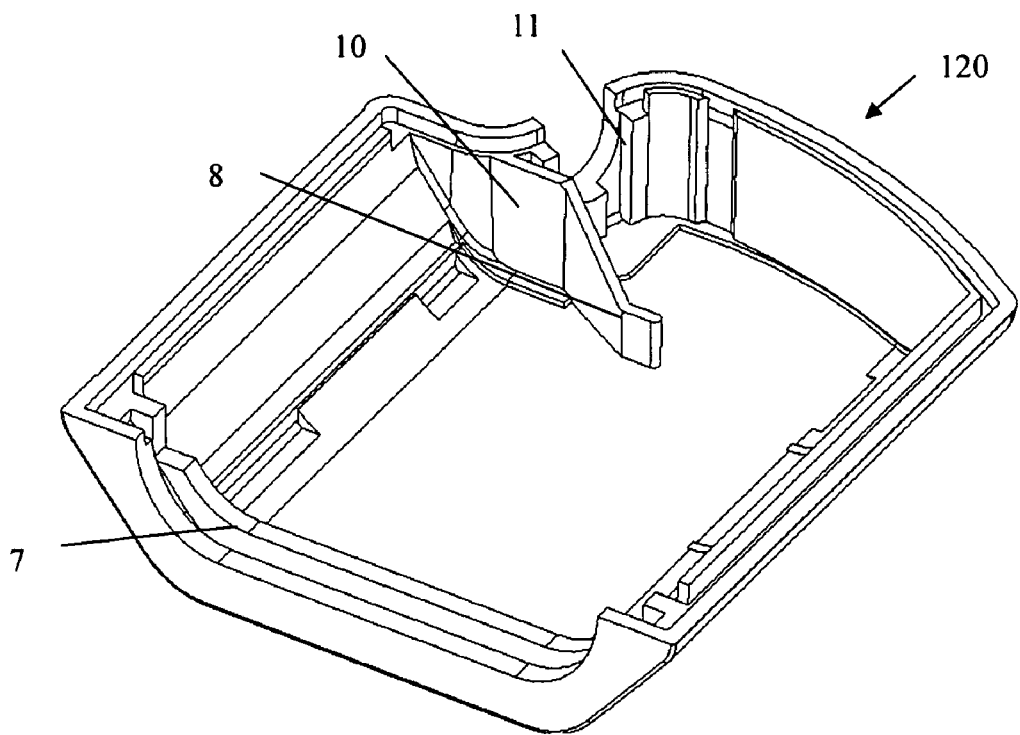
FIG. 6 is a detailed view of a lower shell of the enclosure in accordance with a preferred embodiment of the present invention.

The dimension of the enclosure 100 of the plugtype power supply unit 10 complies with the dimension requirement according to NEMA 1-15P. A cross-sectional configuration of the frontwall 130 of the enclosure 100 is according to and not exceeding the cross-sectional configuration of a plug face of an American type plug according to the NEMA 1-15Pstandard, as shown in FIG. 4. Referring to FIG. 6, a detailed view of the lower shell 120 of the enclosure 100 in accordance with the preferred embodiment of the present invention is shown. A plurality of ribs 7, 8, 10, and 11 extend from an inner wall of the lower shell 120. The external profiles of the upper shell 110 and the lower shell 120 are symmetrical, but the location, width and length of ribs of the upper shell 110 and the lower shell 120 are differently arranged based on the construction requirements. The rib 7 is engaged with the base 21 of the plug portion 150 for securing the plug portion 150 to the enclosure 100. The width of the rib 8 is substantially 1 mm engaging into a slot of the PCB 300 for resolving safety standard problem, which is one of approaches to resolving foreseeable safety standard problems. The rib 10 is mainly for strengthening mechanical integrity. The rib 11 is formed corresponding to the extending position of the low-voltage cord 200 for fixing the low-voltage cord 200. According to the preferred embodiment of the present invention, the ribs of the enclosure are integrally moulded with the enclosure.

To comply with mechanical integrity requirements, the thickness of the enclosure 100 is substantially 1 mm. To enlarge the inner space of the enclosure 100 as much as possible, the thickness of the enclosure 100 is not more than 2 mm.

Figure 7:
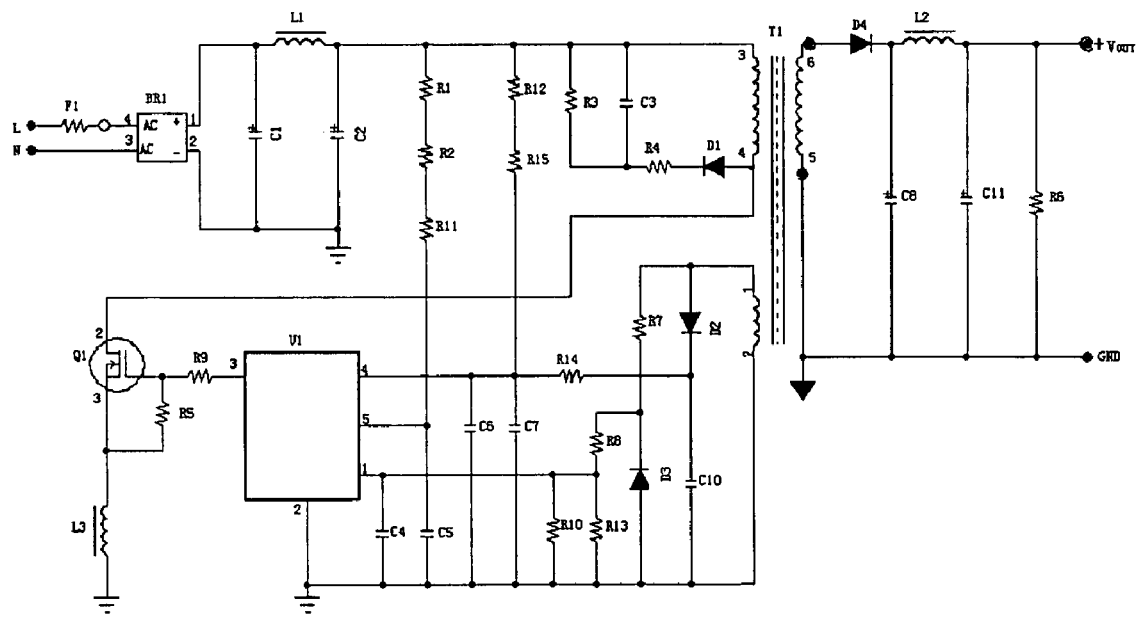
FIG. 7 is a schematic diagram of a switch mode power supply circuit of the plugtype power supply unit in accordance with a preferred embodiment of the present invention.

Referring to FIG. 7, FIG. 7 is a schematic diagram of a switch mode power supply circuit of the plugtype power supply unit in accordance with a preferred embodiment of the present invention. An AC power having a voltage from 85V to 264V and a frequency of approximately 50 Hz is throttled down by an insurance resistance F1 of resistance type, and is then sequentially rectified by a rectifying bridge BR1, and wave filtered by a filter network comprising a capacitor C1, an inductor L1 and a capacitor C2. Consequently a lower ripple level DC power is achieved. The DC power gained is processed sequentially by a controlling IC U1, a switching component Q1 and a primary winding of a transformer T1, and then a periodic pulsating power is achieved. The pulsating power gained is transferred forward to a secondary winding of the transformer T1, which is further rectified by a diode D4 and a capacitor C8 so that a lower ripple level DC power is achieved. Then the DC power is further wave filtered by a filtering network comprising an inductor L2 and a capacitor C11, consequently a high-qualified DC power is achieved, which is output to the terminal devices of users. A bias winding 1-2 of the transformer T1 and its peripheral circuit forms a high-qualified sample feedback controlling system, which provides appropriate contribution for outputting a high-qualified DC power in said switch mode power supply circuit according to the preferred embodiment of the present invention.

The filtering network comprising the capacitor C1, the inductor L1 and the capacitor C2, a filtering network comprising capacitors C4, C5, C6, and C7 in said switch mode power supply circuit are enabled to suppress the EMI of a finished product according to the preferred embodiment of the present invention, which allows the finished product to pass the global EMI specifications, for example, EN55022 CLASS B, etc. The resistance F1 is a power resistance, which is selected from 1 ohm to 100 ohms. When said switch mode power supply circuit is started up, the resistance F1 serves to throttle a surge current so as to minimize the attack from the mains power supply. During said switch mode power supply circuit operation, if failures such as an internal short circuit occur, the resistance F1 is immediately broken, functioning like a fuse, so as to ensure safety of operation of other electric appliances at the same time. Therefore, the resistance F1 solves problems about safety standards and is an important factor to ensure security of a finished product according to the preferred embodiment of the present invention.

Furthermore, in order to resolve EMI problems of minisize plug-type power supply unit 10, the switch mode power supply circuit employs a specified IC U1 with a switching frequency vibration. Switching frequency vibration technology is a proposed effective approach to reducing conducting interference in the industry. The IC U1 integrates the technology thereinto, thus omitting an accessorial frequency vibration control circuit, which not only reduces cost, but also the space of the PCB 300 occupied by the components.

Figure 8:
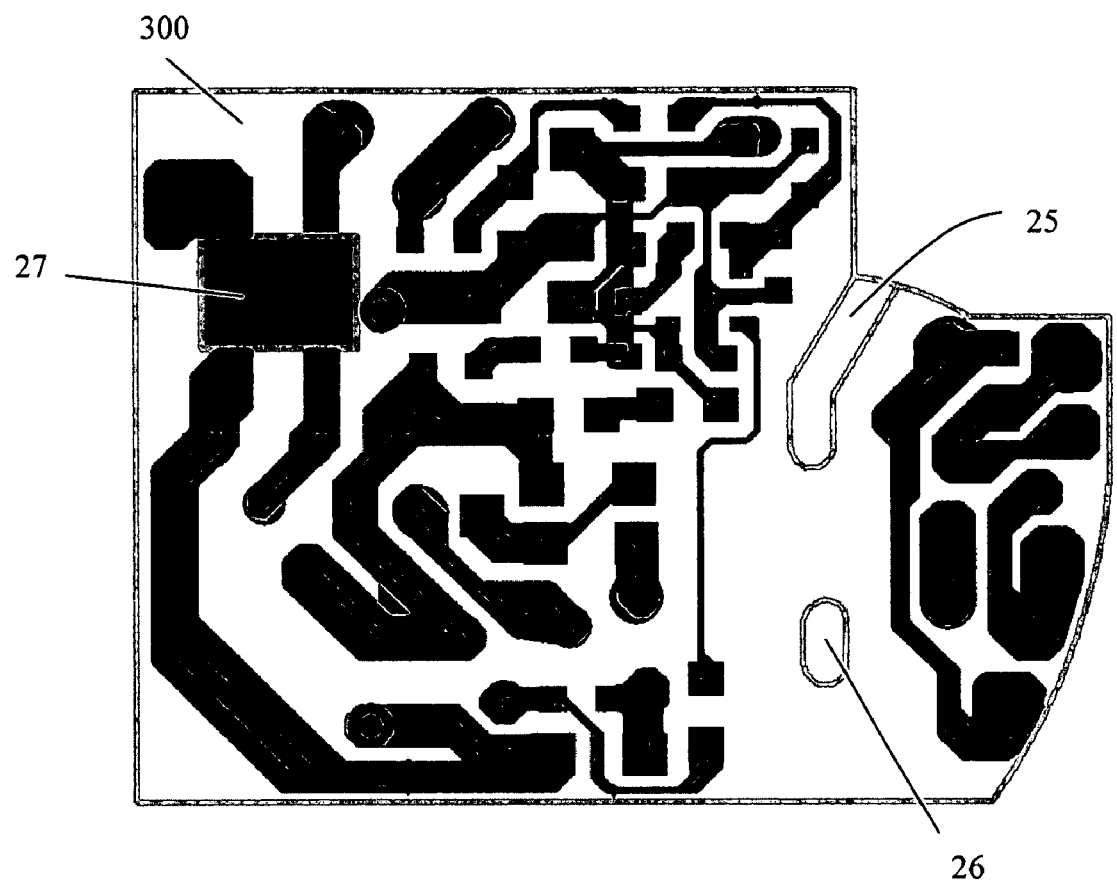
FIG. 8 is a plane view of a printed circuit board of the switch mode power supply circuit shown in FIG. 7.

Referring to FIG. 8, FIG. 8 is a plane view of the printed circuit board (PCB) 300 of the switch mode power supply circuit shown in FIG. 7. A critical feature of the preferred embodiment of the present invention is that: the PCB 300 complies with the requirements of performance, safety standards and other predetermined requirements. The PCB 300 is retained in the enclosure 100 perpendicular to the frontwall 130 of the enclosure 100. As shown in FIG. 8, slots 25, 26, 27 are defined on the PCB 300. Due to the narrow space, there is a strict safety isolation demand to the product according to the present invention between the dangerous input AC power zone and the safe lower output power zone. Slots are employed where safety isolation space is not enough. In this embodiment, slots 25 and 26 of the PCB 300 are one of the methods used to resolve safety standards problems, as well as one of features of the present invention. Furthermore, the rib 10 of the enclosure 100 passes through the corresponding slot 25 of the PCB 300 so as to isolate the wires and components of the PCB 300 on each side of the slots 25. In other embodiments, either the components with high voltage or the components with low voltage are wrapped with three-layer high voltage proof insulating tape so as to isolate the adjacent components with different voltage levels.

The slot 27 is provided for inlaying a higher component in order to ensure heights of the components on the PCB 300 are in the range of the inner height of the enclosure 100. Furthermore, in the preferred embodiment of the present invention, the height of the PCB 300 is from 0.6 mm to 1.2 mm. The PCB 300 can not be too thick because space is precious, but in order to maintain mechanical integrity, the PCB 300 can not be too thin. A preferred range from 0.6 mm to 1.2 mm of the thickness of the PCB 300 is a tradeoff between these two aspects, and the thickness is unable to be more than 2 mm. The size and shape of the PCB 300 is designed to fit the inner space of the enclosure 100.

Figure 9A:
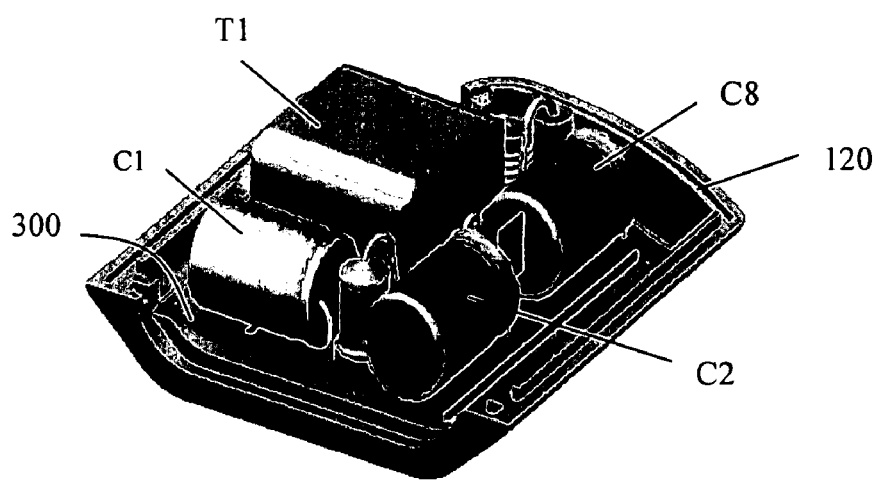
FIG. 9 is a schematic view of components of switch mode power supply assembled on the printed circuit board of the present invention.

FIG. 9 is a schematic view of components of the switch mode power supply circuit assembled on the PCB 300 of the present invention. FIG. 9A is the exploded view of the PCB 300 disposed inside housing 10. Provided that satisfying requirement of performance, in order to reduce the number of components on the PCB 300 as possible, topology of switch circuit must adopt single-end reverse switch power converting circuit. Projections on the frontwall 130 of all components installed on the PCB 300 are within the range of the frontwall 130. In particular, some big capacity components, such us electrolytic capacitor C1 of primary circuit of high withstand voltage transformer T1 and capacitor C8 of secondary circuit will be laid down for installation, not upright installed, that is, big capacity components or high withstand voltage electrolytic capacitors on the PCB 300 are mounted in the direction of their axes parallel to the PCB 300.

Figure 9B:
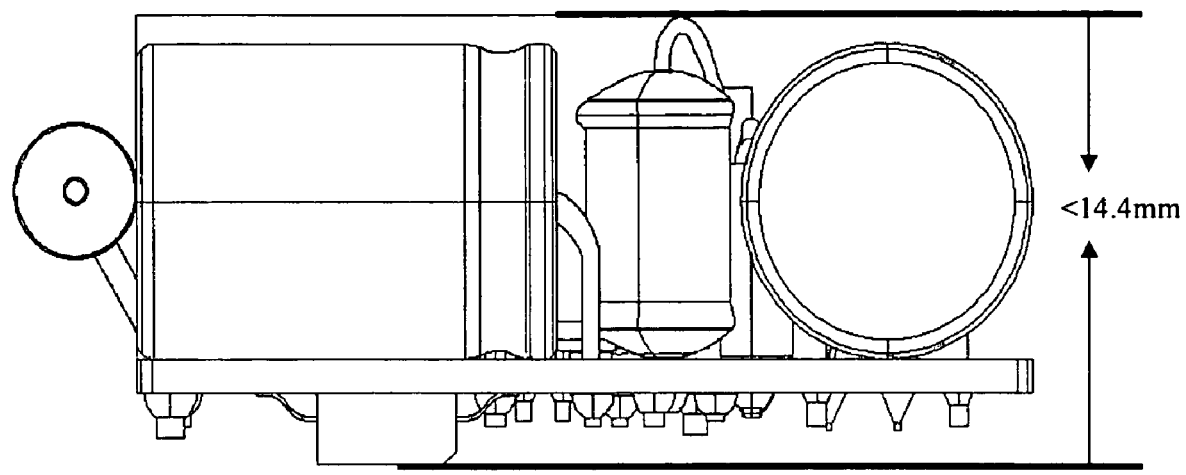

FIG. 9B illustrates a cross-sectional view of the assembled PCB 300 with components. As shown in FIG. 9 all the cross-sectional heights of the PCB 300 and components installed thereon are not more than 14.4 mm. Components of the switch mode power supply circuit are installed on both sides of the PCB 300, one side of the PCB 300 is used for installing high components, such as a bulk electrolytic capacitor or a transformer, and the opposite side is used for installing components not higher than 2.5 mm. Transformer chosen is lower than 14.4 mm, the diameter of the electrolytic capacitors herein must be lower than 14.4 mm, other components must ensure their vertical heights are lower than 14.4 mm after installation on the PCB 300. The PCB 300 adopts a stereo-layout, some lower components are installed beneath the higher components.

Figure 10:
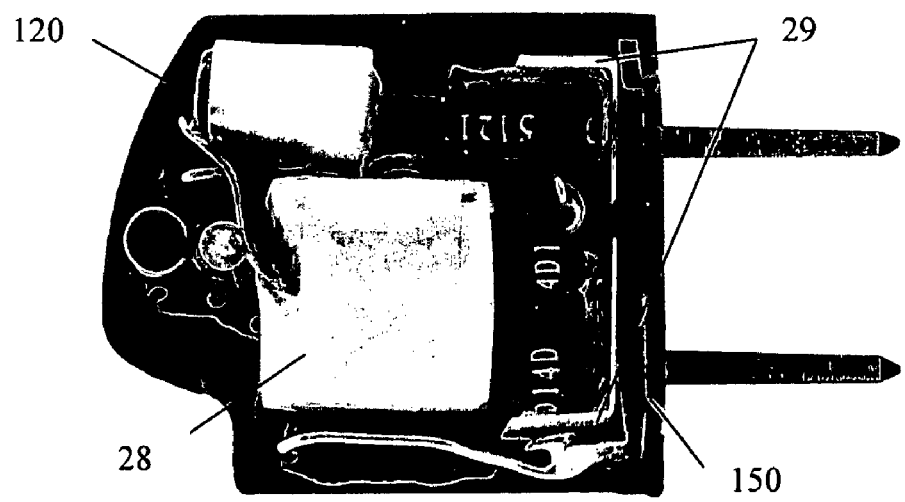
FIG. 10 is a schematic view of Mylar sheets disposed inside the enclosure of the present invention.

FIG. 10 is a schematic view of Mylar sheets disposed inside enclosure 100 of the present invention. For the purpose of insulating and protecting, Mylar sheets are disposed between components and wires required to be isolated. In one embodiment of the present invention, in order to satisfy requirement of safety standards, an L-shaped Mylar sheet 29 is disposed between metal sheet 22 of plug portion 150 and components of the PCB 300, to isolate and prevent the insulating layer on surface of the components from scraping during the components are pressed.

In some embodiments, in order to meet safety specifications, some pins of components leading with dangerous voltage are further provided with Teflon bushing.

Transformer 28 provided on the PCB 300 is a dangerous high voltage component, three-layer high voltage proof insulating tape is encapsulated the external surface of transformer 28 so as to achieve isolation that complies with safety standards. Basically, the PCB 300 has a low-voltage said and a high-voltage side thereon. The primary winding of transformer 28 is welded on the PCB 300 through leading of the transformer 28, the secondary winding is winded by three-layer insulating lines, and is welded onto the lower-voltage side of the PCB 300 by means of flying leads.

Figure 11A:
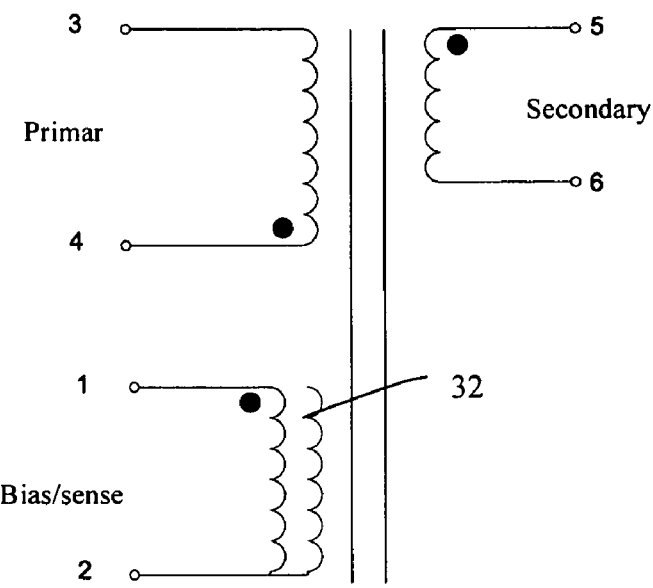
FIG. 11 and FIG. 12 are schematic views of transformers provided with shielding windings of the switch mode power supply circuits in accordance with two preferred embodiments of the present invention.

FIG. 11 and FIG. 12 are schematic views of transformers provided with shielding windings of the switch mode power supply circuits in accordance with two preferred embodiments of the present invention. As shown in FIG. 11A, the transformer used in the present invention comprises a primary winding 3-4, a biased sampling winding 1-2 and a secondary winding 5-6. In one preferred embodiment of the present invention, one shielding winding 32 is provided between the primary winding 3-4 and the secondary winding 5-6 of the transformer. The shielding winding 32 is connected to the grounding of primary winding 3-4 through a leading 2. The shielding winding 32 is a multi-line parallel winding, typically 4 to 6 lines of parallel winding.

Figure 11B:
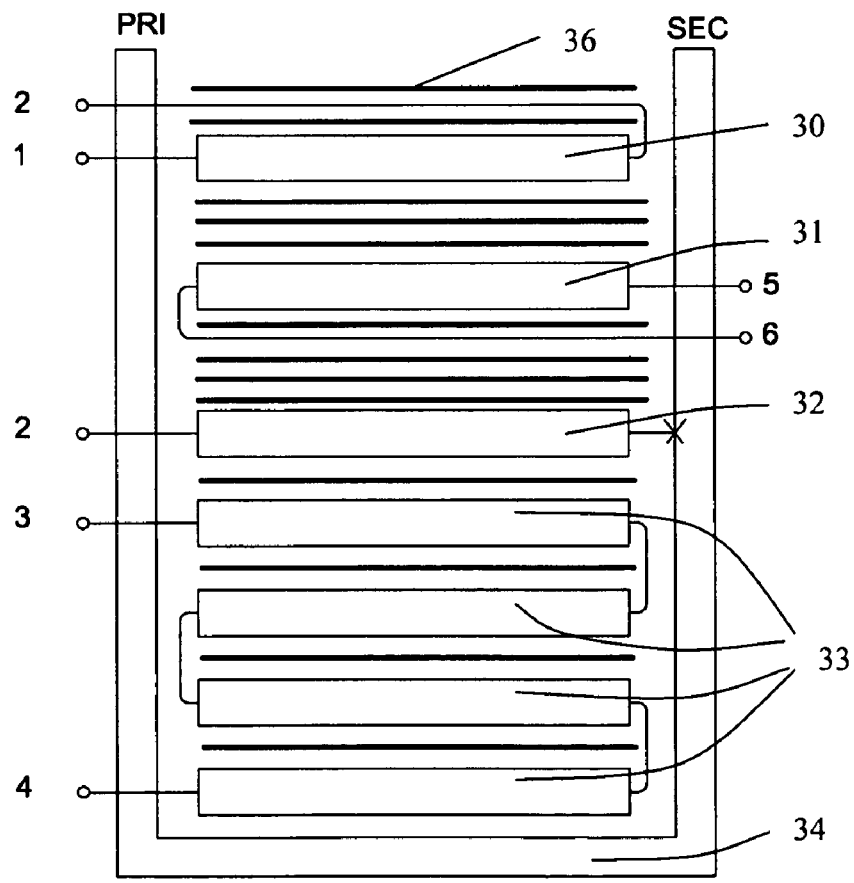

FIG. 11B is schematic view of the windings of the transformer corresponding to the schematic diagram in FIG. 11A. The transformer comprises a biased sampling winding 30, a secondary winding 31, a primary winding 33. All windings are accommodated in a winding compartment 34 of the transformer. One or more pieces of high voltage proof tape 36 are mounted among each winding. A shielding winding 32 is connected to the primary grounding through the leading 2 through welding one end of the shielding winding 32 and leading 2 together, the other end of the shielding winding 32 is open circuit. The shielding winding 32 forms an isolating shield which serves to suppress the EMI between the primary winding 33 and the secondary winding 31 of the transformer.

Figure 12A:
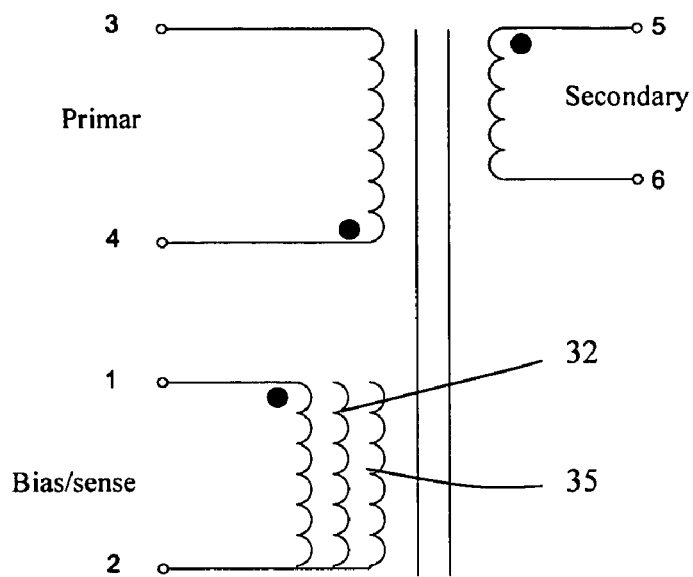
Figure 12B:
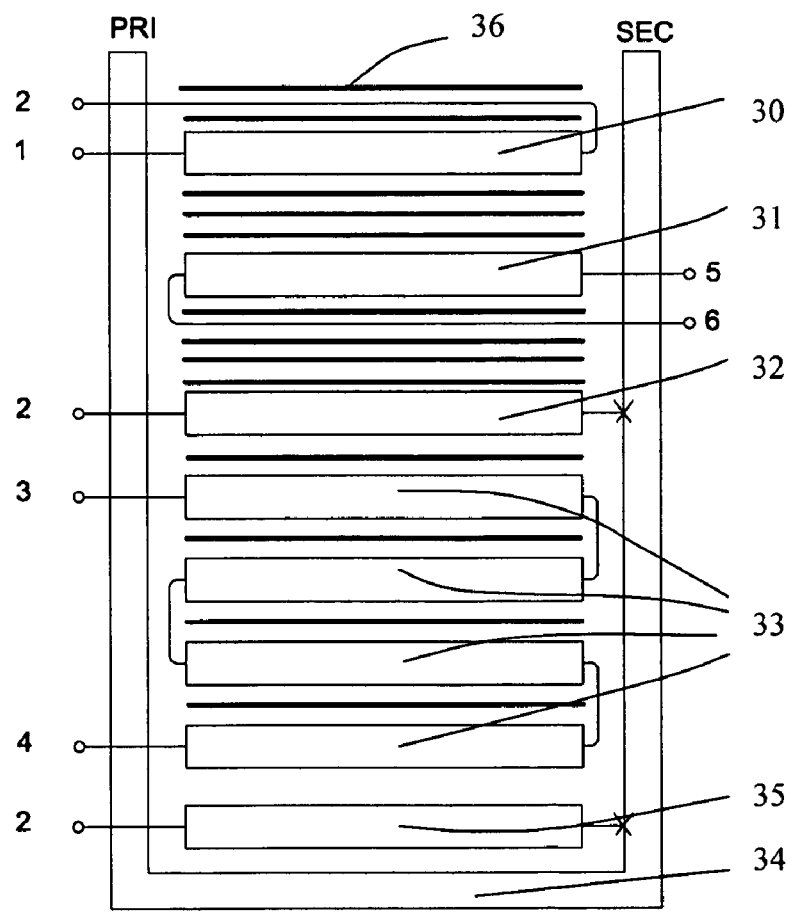

FIGS. 12A and 12B are a schematic diagram and a windings view of the design of the transformer for EMI suppression in another embodiment, respectively. Compared with the embodiment shown in FIG. 11A and FIG. 11B, the difference is: a shielding winding 35 of multi-line (4-6 lines) parallel winding is mounted between the primary winding 33 and the bottom of the winding compartment 34 of the transformer. The shielding winding 35 is winded and welded by means similar to the shielding winding 32.

Furthermore, in another embodiment of the present invention, in order to suppress EMI, the external surface of the transformer is wrapped in a copper foil which functions like a shielding connected to an earth contact of the primary winding. It has been proved this shielding approach can also achieve a desired EMI suppressing effect.

Besides complying with the basic performance requirements of a desired power supply device, the arts of the present invention have to resolve the difficulties of PCB design due to the narrow spatial limitations, and the difficulties of the final product approval within the safety standards. Therefore the preferred embodiment of the present invention is a combination of various special techniques. There is respective preferred embodiment of corresponding elements of the present invention, such as the transformer, capacitors, and topology of the PCB. The different selections from the preferred embodiments of the elements of the present invention combine an ultimate embodiment of the present invention, in other words, any combination of various embodiments is within the scope of the present invention.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A plugtype power supply unit, comprising:
   an enclosure defining a frontwall;
   a plug portion secured to said frontwall of said enclosure;
   a low-voltage cord extending from a rear part of said enclosure;
   a PCB of a switch mode power supply circuit accommodated in said enclosure, said switch mode power supply circuit comprising a transformer for power converting and a capacitor for regulating an input voltage, said plug portion and said low-voltage cord electric connected with said PCB, projection on said frontwall of each cross section parallel to said frontwall of said PCB and components of said switch mode power supply circuit mounted on said PCB not exceeding the range of said frontwall, and structural configuration of said frontwall corresponding to and not exceeding the cross-sectional configuration of a plug face of an American type plug according to the NEMA 1-15P standard;
   a plurality of slots is formed in said PCB between a dangerous high-voltage side and a low-voltage side of said switch mode power supply circuit; and
   a plurality of ribs extends from an inner wall of said enclosure corresponding to the plurality of slots at said PCB, not only for isolating components or wires at both sides of said slot of said PCB, but also for strengthening mechanical integrity of said enclosure.

2. The plugtype power supply unit as claimed in claim 1, wherein a central axis of said capacitor is disposed parallel to the direction of said PCB.

3. The plugtype power supply unit as claimed in claim 1, wherein at least one shielding winding of multi-line parallel winding connected to grounding is provided between a primary winding and a secondary winding of said transformer.

4. The plugtype power supply unit as claimed in claim 1, wherein an external surface of said transformer is wrapped in a three-layer high voltage proof insulating tape for achieving isolation complying with safety standards.

5. The plugtype power supply unit as claimed in claim 1, wherein a secondary winding of said transformer is winded by three-layer insulating lines, and is welded on a lower-voltage side of said PCB by means of flying leads.

6. The plugtype power supply unit as claimed in claim 1, wherein an external surface of said transformer is wrapped in a copper foil functioning like a shielding connected to an earth contact of the primary winding for achieving an EMI suppressing effect.

7. The plugtype power supply unit as claimed in claim 1, wherein said switch mode power supply circuit further comprises an insurance resistance to throttle down a surge current from a mains power supply, and at least one filter network comprising a capacitor and an inductor.

8. The plugtype power supply unit as claimed in claim 1, wherein said switch mode power supply circuit further comprises a control IC with a switching frequency vibration.

9. The plugtype power supply unit as claimed in claim 1, wherein components of said switch mode power supply circuit mounted on said PCB adjacent to a dangerous high voltage or with a dangerous high voltage are wrapped in three-layer high voltage proof insulating tapes, such as said capacitor.

10. The plugtype power supply unit as claimed in claim 1, wherein a plurality of Mylar sheets is disposed on said PCB between components and wires required to be isolated.

11. The plugtype power supply unit as claimed in claim 1, wherein a hole is defined in said PCB for inlaying a higher component so as to fit the height of the inner space of said enclosure.

12. The plugtype power supply unit as claimed in claim 1, wherein said PCB adopts stereo-layout, some lower components are installed beneath the higher components thereof.

13. The plugtype power supply unit as claimed in claim 1, wherein a design of dimension and configuration of said plug portion and said frontwall of said enclosure is based on the plug standard corresponding to various countries and districts.

14. A plugtype power supply unit, comprising:
an enclosure and a plug portion secured thereto;
a low-voltage cord extending from said enclosure;
each cross-sectional configuration of said enclosure with said plug portion corresponding to and not exceeding the cross-sectional configuration of a plug face of an American type plug according to the NEMA 1-15P standard; and
a switch mode power supply circuit mounted on a PCB built into said enclosure, said switch mode power supply circuit comprising a transformer for power converting and a capacitor for regulating an input voltage, and a control IC,
wherein a central axis of said capacitor disposed parallel to the direction of said PCB.

15. The plugtype power supply unit as claimed in claim 14, wherein at least one shielding winding of multi-line parallel winding connected to grounding is provided between a primary winding and a secondary winding of said transformer.

16. The plugtype power supply unit as claimed in claim 14, wherein an external surface of said transformer is wrapped in a three-layer high voltage proof insulating tape for achieving isolation complying with safety standards.

17. The plugtype power supply unit as claimed in claim 14, wherein a secondary winding of said transformer is winded by three-layer insulating lines, and is welded on a lower-voltage side of said PCB by means of flying leads.

18. The plugtype power supply unit as claimed in claim 14, wherein an external surface of said transformer is wrapped in a copper foil functioning like a shielding connected to an earth contact of the primary winding for achieving an EMI suppressing effect.

19. The plugtype power supply unit as claimed in claim 14, wherein said switch mode power supply circuit further comprises an insurance resistance to throttle down a surge current from a mains power supply, and at least one filter network comprising a capacitor and an inductor.

20. The plugtype power supply unit as claimed in claim 14, wherein said switch mode power supply circuit further comprises a control IC with a switching frequency vibration.

21. The plugtype power supply unit as claimed in claim 14, wherein components of said switch mode power supply circuit mounted on said PCB adjacent to a dangerous high voltage or with a dangerous high voltage are wrapped in three-layer high voltage proof insulating tapes, such as said capacitor.

22. The plugtype power supply unit as claimed in claim 14, wherein a plurality of slots is formed in said PCB between a dangerous high-voltage side and a low-voltage side of said switch mode power supply circuit.

23. The plugtype power supply unit as claimed in claim 14, wherein a plurality of ribs extends from an inner wall of said enclosure corresponding to the plurality of slots at said PCB, not only for isolating components or wires at both sides of said slot of said PCB, but also for strengthening mechanical integrity of said enclosure.

24. The plugtype power supply unit as claimed in claim 14, wherein a plurality of Mylar sheets is disposed on said PCB between components and wires required to be isolated.

25. The plugtype power supply unit as claimed in claim 14, wherein a hole is defined in said PCB for inlaying a higher component so as to fit the height of the inner space of said enclosure.

26. The plugtype power supply unit as claimed in claim 14, wherein said PCB adopts stereo-layout, some lower components are installed beneath the higher components thereof.

27. The plugtype power supply unit as claimed in claim 14, wherein a design of dimension and configuration of said plug portion and said frontwall of said enclosure is based on the plug standard corresponding to various countries and districts.

* * * * *